(12) United States Patent
Ishimaru

(10) Patent No.: US 6,420,734 B1
(45) Date of Patent: *Jul. 16, 2002

(54) LIGHT EMITTING DIODE AND A METHOD MANUFACTURING THE SAME

(75) Inventor: Makoto Ishimaru, Tokyo (JP)

(73) Assignee: Oki Electric Industry Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/241,151

(22) Filed: Feb. 1, 1999

(30) Foreign Application Priority Data

Jan. 30, 1998 (JP) .......................................... 10-019989

(51) Int. Cl.$^7$ .............................................. H01L 33/00
(52) U.S. Cl. ............................ 257/91; 257/88; 257/101
(58) Field of Search ............................. 257/91, 88, 101

(56) References Cited

U.S. PATENT DOCUMENTS 3,806,777 A * 4/1974 Edmonds ..................... 257/91
5,600,157 A * 2/1997 Abiko ......................... 257/101

FOREIGN PATENT DOCUMENTS

JP         06310755         11/1994

* cited by examiner

Primary Examiner—Jerome Jackson, Jr.
(74) Attorney, Agent, or Firm—Venable; Robert J. Frank; James R. Burdett

(57) ABSTRACT

An LED is provided with a p-type semiconductor region in the shape of an island being buried in an n-type semiconductor region from the surface of it, and forms a pn junction at the interface between these n-type region and p-type region. The pn junction has a bottom junction at the bottom of the n-type region and a side junction at the peripheral side face. The bottom junction comprises a first subjunction being deep and constant in junction depth and a second subjunction varying continuously in junction depth. The depth of the second subjunction is shallower than the depth of the first subjunction. The p-type region portion above the second subjunction is thinner in thickness than the p-type region portion above the first subjunction. A light passing through the p-type region portion of the former is less in absorptior and more in optical power of the output light. The total power of the output light of the whole LED is increased correspondingly to reduction in thickness of the p-type region.

6 Claims, 8 Drawing Sheets

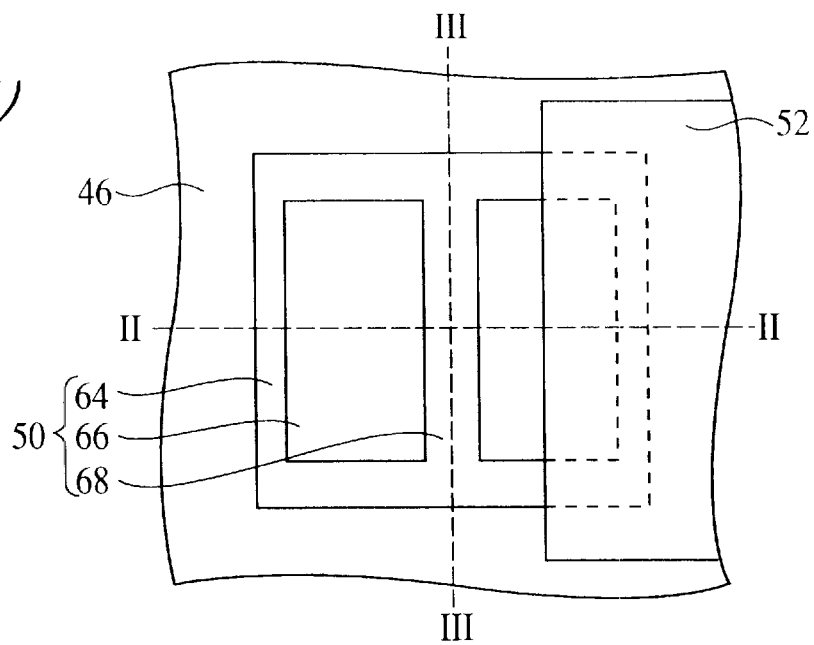
FIG.4(A)
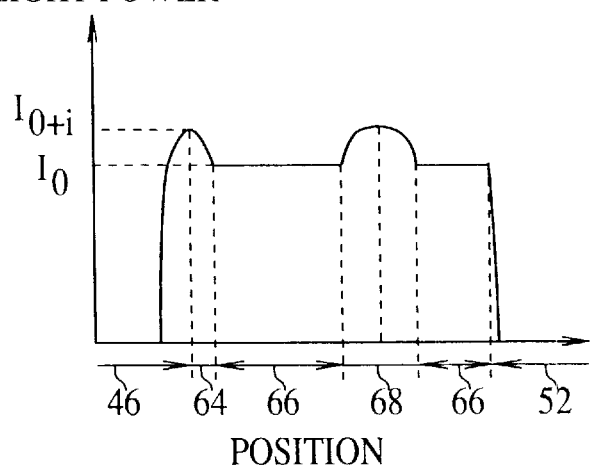
FIG.4(B) LIGHT POWER
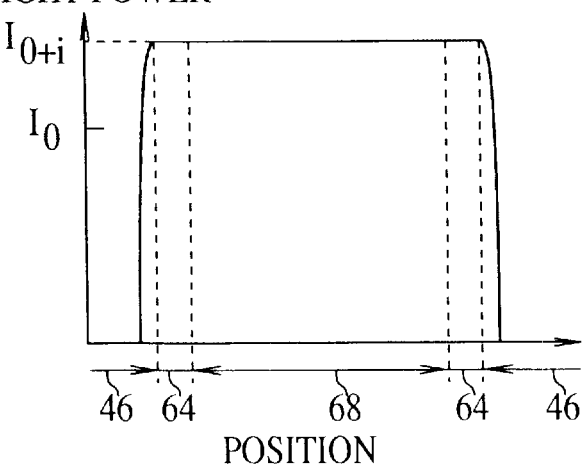
FIG.4(C) LIGHT POWER

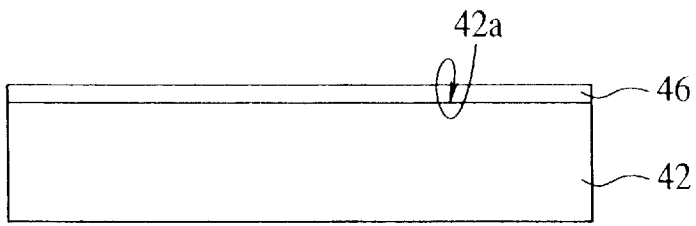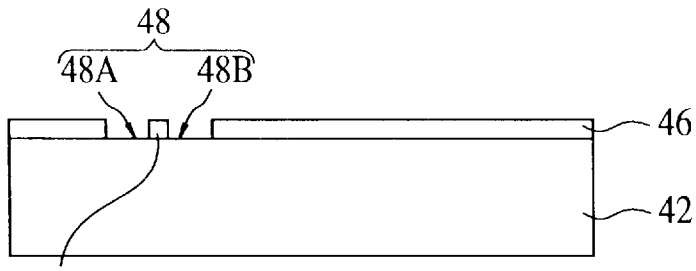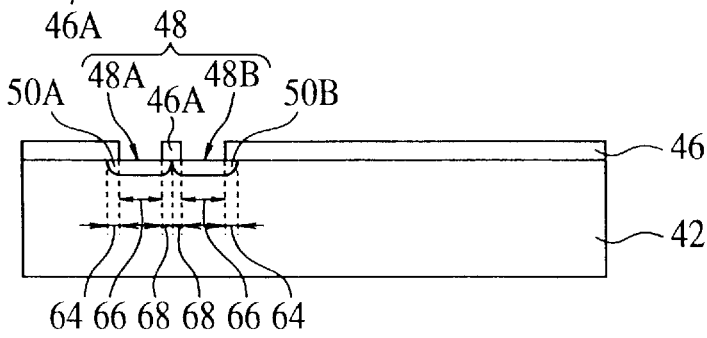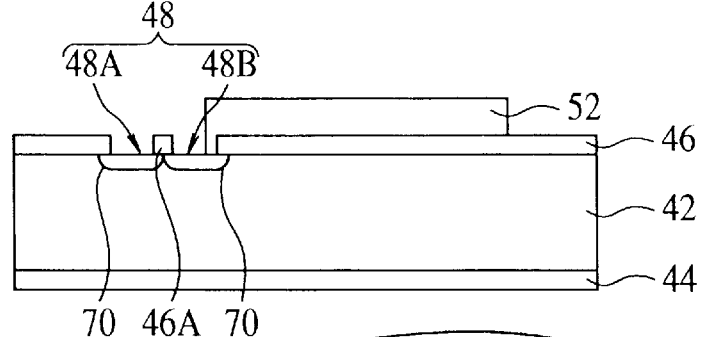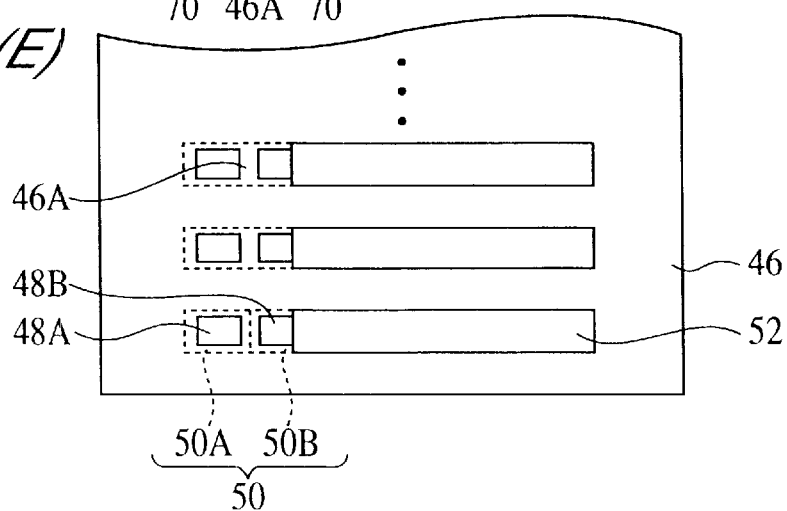

PRIOR ART

LIGHT EMITTING DIODE AND A METHOD MANUFACTURING THE SAME

BACKGROUND OF THE INVENTION

1. Field of the Invention

The present invention relates to a light emitting diode, and particularly to a light emitting diode having a structure capable of heightening the optical output and a method for manufacturing the same.

2. Description of Related Art

A light emitting diode array in which planar-type light emitting diodes (LEDs) are arranged in an array has been put to practical use for an LED printer and the like. An example of the fundamental structure of such a former light emitting diode array is briefly described with reference to FIG. 7 and FIGS. 8(A) to 8(C). The light emitting diode array 10 is provided with an insulating film 16 on one main surface (upside) 12a of an n-type semiconductor region 12. The insulating film 16 has a plurality of diffusion windows 20 formed by etching. These diffusion windows 20 are arranged at regular intervals in a line. This array 10 has individual p-type diffusion regions, namely, p-type semiconductor regions 28 each of which is formed by diffusing zinc (Zn) as an impurity into an n-type semiconductor region 12 exposed in a diffusion window 20. The p-type semiconductor region 28 is an island-shaped surface-diffused region surrounded by the n-type semiconductor region 12, and the respective upsides 12a and 28a of the n-type and p-type semiconductor regions are in a common plane. The junction 30 between both the regions is in the shape of a dish. Ordinarily, the p-type semiconductor regions adjacent to each other are isolated from each other. Individual p-side electrodes 24 electrically connected to the respective p-type semiconductor regions are formed on the insulating film 16. An n-side electrode 26 is formed on the other main surface (reverse side) of the insulating film 16.

FIG. 8 shows part of the former light emitting diode array, focusing on one LED. Particularly, FIG. 8(A) is a sectional view taken along line X–Y of FIG. 7. FIG. 8(B) is a plan view mainly showing the p-type semiconductor region exposed in the diffusion window 20. FIG. 8(C) is an optical output characteristic curve diagram for explaining an output characteristic of this LED, and the abscissa shows a position and the ordinate shows an optical output (in an arbitrary unit).

The p-type semiconductor region 28 described above comprises a first partial region $R_1$ which is constant in depth (thickness) from its upper surface 28a and a second partial region (also referred to as a peripheral region) $R_2$ which is its peripheral region and is shallower (thinner) than the first partial region $R_1$ in depth (thickness) from the upper surface 28a. Since the junction 30a of the first partial region $R_1$ in the junction interface is substantially in parallel with the upper surface, the depth of the junction has a constant value $L_1$. On the other hand, the junction 30b of the second partial region $R_2$ becomes gradually shallower as it becomes more distant from the first partial region $R_1$. Finally, the junction 30b ends at the boundary between the upper surfaces 12a and 28a (the peripheral edge of the p-type semiconductor region 28) $R_{20}$.

Therefore, the thickness of the second partial region $R_2$ gradually varies from depth $L_1$ to depth "0" according to a position in it.

When letting an electric current flow between both the electrodes 24 and 26 of an LED 10 having such a structure as this, electrons and holes are recombined in the junction 30 to generate light. Generated light B passes through the p-type semiconductor region 28 and is outputted from the diffusion window 20 (see FIG. 7).

Hereupon, the light $B_1$ generated at the junction 30a of the first partial region $R_1$ passes through said first partial region $R_1$ being thicker in thickness and then is outputted. The light $B_2$ generated at the junction 30b of the second partial region $R_2$ passes through said second partial region $R_2$ being thinner in thickness and then is outputted. Now, it is assumed that a quantity of light generated in a unit area of the junction interface is constant. The generated light passes through these first and second partial regions $R_1$ and $R_2$ in the direction perpendicular to the upper surface of these regions. In this case, a quantity of light absorbed in these partial regions is the maximum in the first partial region $R_1$. A quantity of light absorbed in the second partial region $R_2$ is the maximum at the boundary between the first and second partial regions and is "0" at the peripheral edge $R_{20}$ of the second partial region $R_2$. It becomes gradually smaller as being closer to the peripheral edge $R_{20}$ in the intermediate portion of the second partial region.

It is therefore known that the power of light outputted from the upper surface 28a of the p-type semiconductor region 28 is the minimum $I_0$ in the first partial region $R_1$, and becomes gradually larger so that it is the maximum $I_{0+i}$ (>$I_0$) at the peripheral edge $R_{20}$ in the second partial region $R_2$ (see FIG. 8(C)).

In a former LED having a structure like this, as described above, since light is absorbed in the p-type semiconductor region, the total optical power of outputted light is made smaller. Thereupon, up to now a desired large optical power has been obtained by applying a high voltage between the n-side and p-side electrodes 24 and 26, but applying a high voltage as described above has caused a problem that the power consumption becomes high.

SUMMARY OF THE INVENTION

As a result of various attempts at solving this problem, the inventors have found that if part of the junction of the second partial region, which has been up to now formed so as to be constant in depth from the upper surface, is formed as a shallower junction, absorption of light can be reduced correspondingly to the depth becoming shallower, and thereby have attained the present invention.

Thus, an object of the present invention is to provide a light emitting diode capable of outputting a high-power light without applying a high voltage between the electrodes.

Another object of the invention is to provide a method for manufacturing such a light emitting diode.

In order to attain the objects, according to a first aspect of the present invention, there is provided a light emitting diode (LED) provided with such a structure as described below. This LED is provided with a first conductive-type semiconductor region and a second conductive-type semiconductor region which is buried in the first conductive-type semiconductor region and forms a junction with the first conductive-type semiconductor region. The junction at the bottom of the second conductive-type semiconductor region (said junction being here referred to as a bottom junction) varies in depth from the surface of the second conductive-type semiconductor region according to a position in it.

According to such a structure, when making the maximum depth of the bottom junction of the second conductive-type semiconductor region coincide with the depth of the bottom junction of a former LED, a junction depth at another position in the bottom is shallower than this maximum depth. Therefore, the bottom junction includes a deep junction and a shallow junction. This means that the second conductive-type semiconductor region includes a deep portion and a shallow portion, in other words, that a place where generated light is more absorbed and a place where generated light is less absorbed. Absorption of light depends upon the thickness of the second conductive-type semiconductor region which the light passes through. Accordingly, even if an electric current of high density does not flow between the electrodes by applying between them a high voltage. By this, it is possible to heighten a quantity of output light, namely, an optical power of the LED corresponding to a reduction in absorption of light in the second conductive-type semiconductor region.

In implementing the present invention, the second conductive-type semiconductor region preferably forms a junction with the first conductive-type semiconductor region by having its bottom face and peripheral side face surrounded by the first conductive-type semiconductor region. The upper surfaces of the first and second conductive-type semiconductor regions are in the same plane. The upper surface of the second conductive-type semiconductor region forms a light outputting surface. This second conductive-type semiconductor region comprises a first partial region and a second partial region. The first partial region is a region which is put between the central area of the upper surface of the second conductive-type semiconductor region and the junction at the bottom. The second partial region is a peripheral region which is put between the peripheral area of the upper surface of the second conductive-type semiconductor region and the junction at the peripheral side face and is in contact with the first partial region. This second partial region becomes gradually shallower in depth (namely, thickness) from the upper surface of it as coming from the first partial region nearer to the peripheral edge. That is to say, the depth of the junction at the peripheral side face (said junction being here referred to as a side junction) gradually varies from the depth of the bottom junction to depth "0".

In a structure like this, it is preferable that the first partial region is composed of a plurality of subregions being different in depth (namely, thickness) from one another and the maximum depth of these subregions is substantially equal to the maximum depth of the second partial region.

BRIEF DESCRIPTION OF THE DRAWINGS

The foregoing and other objects, features and advantages of the present invention will be better understood from the following description taken in connection with accompanying drawings, in which:

FIGS. 4 (including 4(A)–4(C)) are figures for explaining distribution of the optical power of a light emitting diode of the present invention, and FIG. 4(A) is a schematic plan view of a main part showing mainly the light emitting face of a light emitting diode of the invention and FIG. 4(B) is a diagram of distribution of the optical power taken along line II—II of FIG. 4(A), and FIG. 4(C) is a diagram of distribution of the optical power taken along line III—III of FIG. 4(A);

FIGS. 5 (including 5(A) to 5(E)) are process diagrams for schematically explaining an example of a method for manufacturing a light emitting diode array utilizing a light emitting diode of the present invention;

FIGS. 8 (including 8(A)–8(C)) are figures for explaining the structure and distribution of the optical power of a former light emitting diode.

DETAILED DESCRIPTION OF THE INVENTION

With reference to the drawings, embodiments of the present invention will be described hereinbelow. The drawings for explaining composition of them roughly show the size, shape and positional relation of the respective components to such a degree that the present invention can be understood in composition.

In sectional views, some hatching for showing sections are omitted in order to avoid complication of the drawings. Embodiments described below are simply preferred examples and therefore it is apparent to the people in the same technical field that the present invention is not limited to only the embodiments described below.

Figure 1:
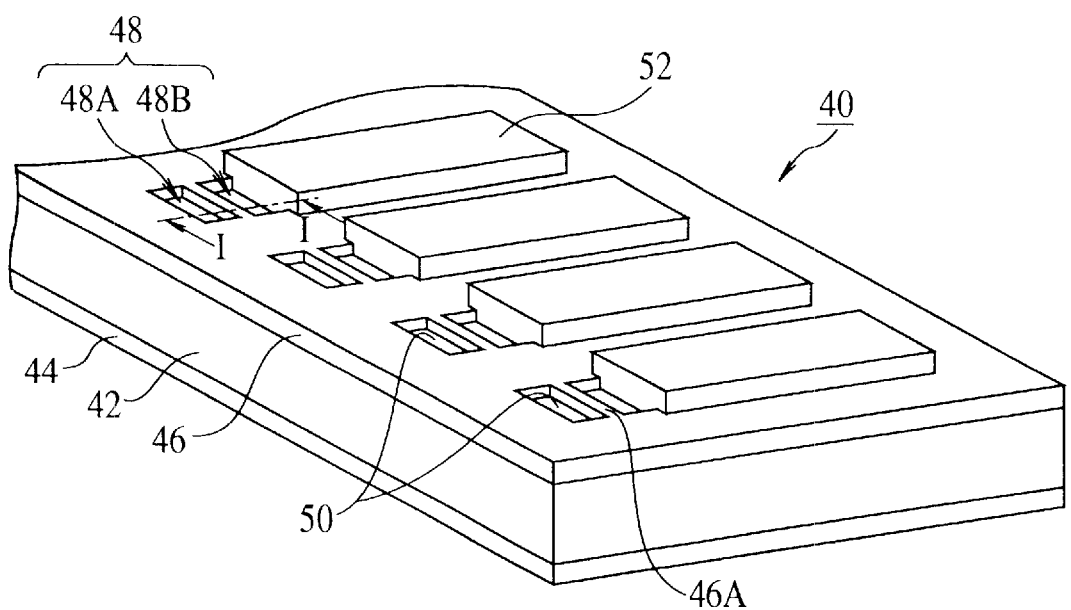
FIG. 1 is a perspective view schematically showing a structural example of a light emitting diode array utilizing light emitting diodes according to the present invention.
Figure 2A:
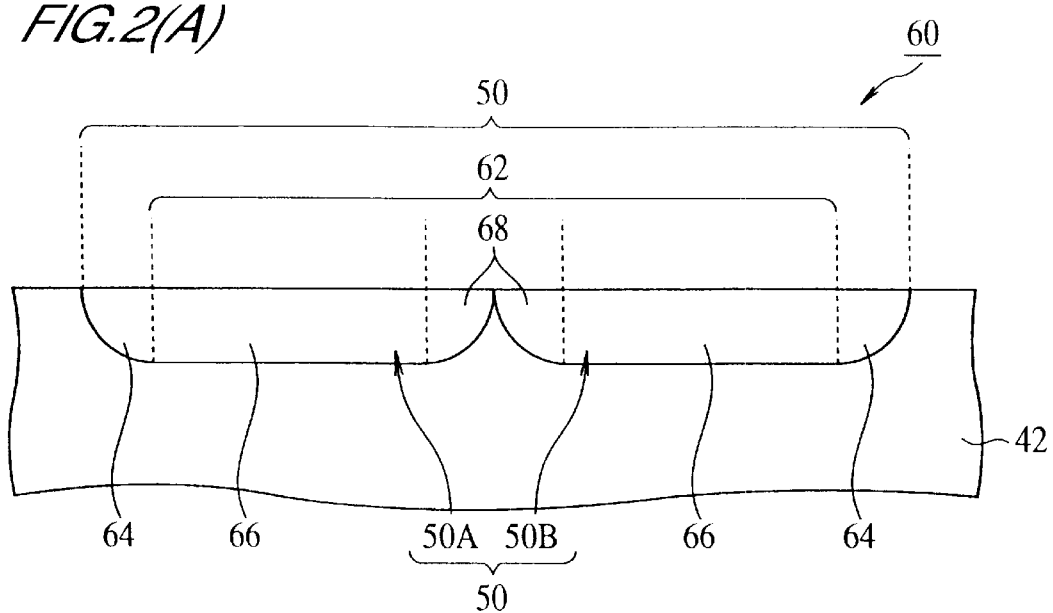
FIGS. 2(A) and 2(B) are sectional views of a main part schematically showing an example of the structure of light emitting diodes according to the present invention.
Figure 2B:
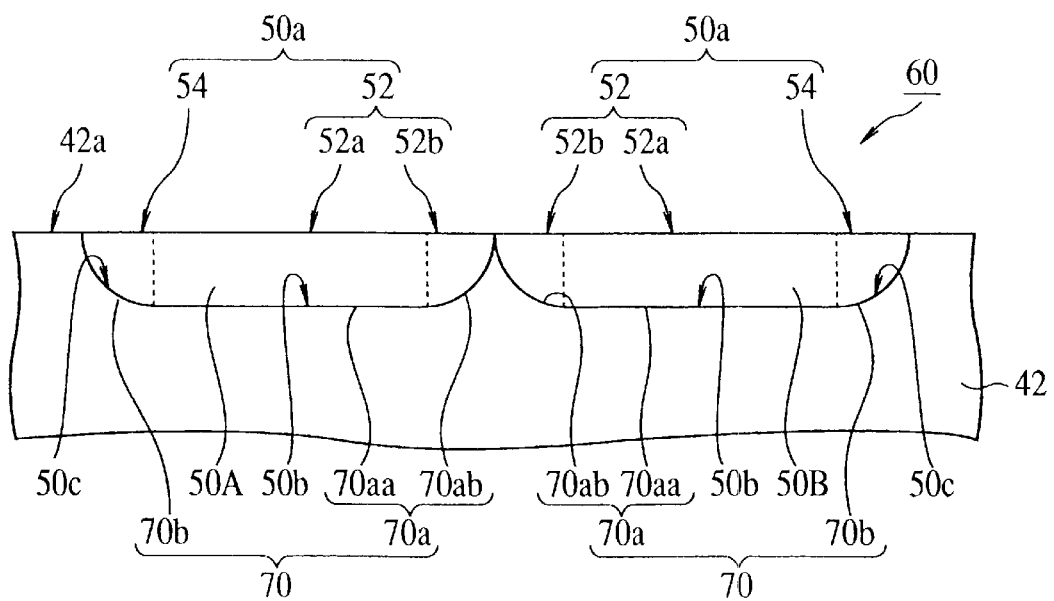
Figure 3:
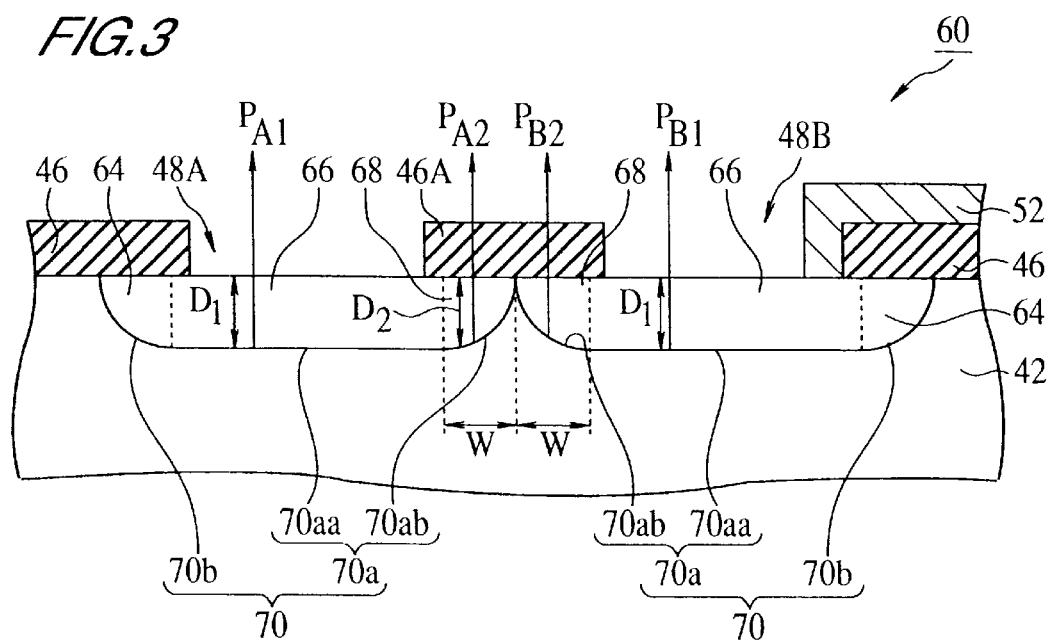
FIG. 3 is a schematic sectional view taken along line I—I of FIG. 1 for explaining operation of a light emitting diode according to the present invention.

First, the structure of a light emitting diode of the present invention is described with reference to FIG. 1, FIGS. 2(A) and 2(B), and FIG. 3. FIG. 1 shows an example of the structure in which such light emitting diodes are incorporated into a light emitting diode array. FIGS. 2(A) and 2(B) are sectional views showing a main part, particularly, first and second conductive-type semiconductor regions for explaining an example of the structure of the light emitting diode, and particularly are sectional views of a part corresponding to a section taken along line I—I of FIG. 1. FIG. 3 is a figure for explaining operation of the light emitting diode and particularly is a sectional view taken along line I—I of FIG. 1.

A light emitting diode array 40 shown in FIG. 1 is formed by arranging a plurality of light emitting diodes of the present invention. This light emitting diode is of planar type. A structural example in which the first conductive type is n-type and the second conductive type is p-type will be described in the following description. A light emitting diode is sometimes referred to as an LED in the following description.

The light emitting diode array 40 comprises a substrate 42 as an n-type semiconductor region, a common n-side electrode 44 provided on the under surface of the substrate 42, an insulating film 46 provided on the upper surface of the substrate 42, diffusion windows 48 provided in this insulating film, a p-type semiconductor region 50 formed by diffusion in the n-type semiconductor region 42, and individual p-side electrodes 52 which are electrically in contact with the p-type semiconductor regions 50 in the diffusion windows 48 and are provided on the insulating film 46. Each of the diffusion windows 48 serves also as a light emitting window of each LED, and it is two-dimensionally in the shape of a tetragon. The insulating film 46 is a transparent film as described later.

The diffusion windows 48 are provided at a plurality of predetermined positions in the insulating film 46 and respectively have substantially the same shape and area, which are determined in advance. In this embodiment, the diffusion window 48 for one LED is formed as two subwindows 48A and 48B. These first subwindows 48A and second subwindows 48B are light emitting windows, and the shape and area of them are also determined in advance according to design. This embodiment is provided with subwindows 48A and 48B by linearly dividing the diffusion window 48 into two parts by means of a bridge 46A for bridging the middle part of the diffusion window 48 in the insulating film 46. The longitudinal direction of the bridge 46A is along the direction of arrangement of LEDs. Accordingly, the subwindows 48A and 48B are arranged in a direction perpendicular to the direction of arrangement of the LEDs, and are two-dimensionally in the shape of a tetragon. A p-side electrode 52 is in contact with one subwindow 48B.

Referring now to one of LEDs forming this light emitting diode array, the structure of the LED will be described in the following. As shown in FIG. 2(A), an LED 60 has an n-type semiconductor region 42 and a p-type semiconductor region 50. The n-type semiconductor region 42 is a region common to the respective LEDs and uses an n-type substrate for example. However, respective regions for respective LED are isolated from each other in the n-type semiconductor region 42. The p-type semiconductor region 50 is buried in the n-type semiconductor region 42 from its surface 42a and forms a pn junction 70 (see FIG. 2(B)) with the n-type semiconductor region 42. This pn junction 70 is a junction for performing a light emitting function of the LED.

In the structural example illustrated here, the p-type semiconductor region 50 is two-dimensionally in the shape of a tetragon. This region 50 comprises a first partial region 62 and a second partial region 64. The first partial region 62 is also two-dimensionally in the shape of a tetragon. The first partial region 62 is a region which is surrounded by the second partial region 64 in the shape of a frame. The second partial region 64 is a region corresponding to the region $R_2$ explained in FIG. 8(A). The first partial region 62 has a first subregion 66 having a maximum value being constant in depth (thickness) from its surface, and a second subregion 68 continuously varying in depth. The first subregion 66, the second subregion 68 and the second partial region 64 are formed as regions containing the same impurity in the same density as one another.

The above-mentioned regions will be described in more detail with reference to FIGS. 2(A) and 2(B) in the following.

The upper surfaces 42a and 50a of the n-type and p-type semiconductor regions 42 and 50 are in the same plane. The p-type semiconductor region 50 forms a pn junction 70 by a fact that its bottom face 50b and peripheral side face 50c are surrounded by the n-type semiconductor region 42. The upper surface 50a of the p-type semiconductor region 50 forms a light emitting surface. In the structural example shown in FIGS. 2(A) and 2(B), the p-type semiconductor region 50 is shown as two regions (50A and 50B) corresponding to the first and second subwindows 48A and 48B. These two regions may be continuous to each other, or may have a pn junction 70 between both the regions. The illustrated structure is an example of the latter.

The first partial region 62 is a region between the middle area 52 of the upper surface 50a of the p-type semiconductor region 50 and a junction 70a (here this junction is referred to as a bottom junction) in the bottom face 50b. The second partial region 64 is a peripheral region which is put between the peripheral area 54 of the upper surface 50a of the p-type semiconductor region 50 and a junction 70b in the peripheral side face 50c, and is adjacent to the first partial region 62. The second partial region 64 becomes gradually shallower in depth (namely, thickness) from the upper surface 54 (50a) as coming from the first partial region 62 nearer to the peripheral edge. That is to say, the depth of the junction 70a in the peripheral side face (here, this junction is referred to as a side junction) varies from the depth of the bottom junction 70a to depth "0" so as to become gradually shallower.

On the other hand, the bottom junction 70a of the p-type semiconductor region 50 (50A, 50B) varies in depth from the upper surface 52 (50a) of the p-type semiconductor region 50 according to a horizontal position (position in an optional direction in parallel with the upper surface 50a). Accordingly, in the present invention, the first partial region 62 is composed of a plurality of subregions being different in depth from one another.

In the structural example shown in FIGS. 2(A) and 2(B), the bottom junction 70a comprises a junction portion 70aa being constant in depth and a junction portion 70ab being shallower than the junction portion 70aa. Thus, each half of the first partial region 62 is composed of two subregions, namely, the first and second subregions 66 and 68 being different from each other in depth (namely, thickness) from the upper surface 52a. Moreover, the first subregion 66 is substantially equal in depth to the maximum depth of the second partial region 64, and is constant in thickness. The depth of the second subregion 68 is shallower than the depth of the first subregion 66 except the depth at the position of junction with the first subregion 66.

When two-dimensionally seeing the second partial region 64 from above, the second subregion 68 having a constant width in the shape of a stripe is provided nearly in the middle of the second partial region 64 in the shape of a tetragonal frame. The second subregion 68 is located on the downside of and along the bridge 46A described in FIG. 1. The second subregion 68 is provided across the second partial regions 64 and 64 at both sides.

The two first subregions 66 each of which is two-dimensionally in the shape of a tetragon are provided at both sides of the second subregion 68. These first subregions 66 and 66 are formed correspondingly to positions of the subwindows 48A and 48B. The junction of the first subregion 66 is a junction portion being constant in depth, and this junction is referred to as a first subjunction 70aa. The junction of the second subregion 68 is a junction portion being shallower than the first subjunction 70aa, and this shallower junction is referred to as a second subjunction 70ab. A direction perpendicular to the longitudinal direction of the bridge 46A is set as the direction of width. The second subjunction 70ab is the shallowest at the middle position in its width direction. The second subjunction 70ab becomes gradually deeper as coming nearer to the first subregions 66 at both sides, and becomes equal in depth to the first subregion 66 and is joined with the first subregion 66. In the embodiment shown in FIGS. 2(A) and 2(B), the depth of the second subjunction 70ab is set as "0" at the center in the width direction of it.

Next, thickness of the first and second subregions 66 and 68, and the absorption and output of light will be described with reference to FIG. 3.

A structural example shown in FIG. 3, as described in FIGS. 2(A) and 2(B), is provided with a p-type semiconductor region 50 in the upside region of an n-type semiconductor region 42 including the upper surface. The p-type semiconductor region 50 has a second partial region 64, a first subregion 66, and a second subregion 68. The first subregion 66 has a constant depth $D_1$. The second subregion 68 gradually varies in depth from $D_1$ to zero ("0"). The first subregion 66 and the second subregion 68 are included in the first partial region 62. Moreover, the second partial region 64 forms the outermost peripheral region of the p-type semiconductor region 50 (see FIG. 2(A)).

The second subregion 68 has the smallest thickness at the center in its width direction, and becomes gradually thicker in thickness as it approaches the first subregions 66 at both sides. Horizontal distances from the boundaries between the second subregions 68 and the first subregions 66 to the center of the second subregions 68 in the width direction are respectively set as W. The respective regions 64, 66, and 68 can be controlled in depth and width by properly determining a kind of dopant to be diffused as an impurity, a diffusion temperature and other required conditions in a manufacturing process of LEDs according to design.

Figure 8A:
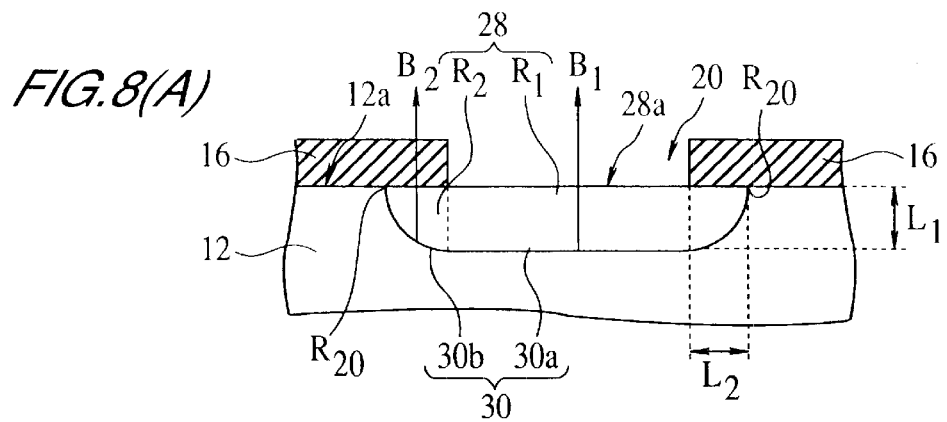
FIG. 8(A) is a schematic plan view of a main part showing mainly the light emitting face of a former light emitting diode and FIG. 8(B) is a schematic plan view paying attention to a diffusion window.

According to the structure of an LED of the present invention, if making the maximum depth $D_1$ of the bottom junction 70a of the second conductive-type semiconductor region 50 coincide with the depth $L_1$ of the bottom junction of a former LED (see FIG. 8(A)), a result is obtained that there is a shallower junction 70ab than the maximum depth $D_1$, namely, $L_1$. Thickness at an optional position in this shallow junction 70ab is represented by $D_2$. Thus the bottom junction comprises a deep junction and a shallow junction. This means that the second conductive-type semiconductor region 50 comprises a thick region (first subregion 66) and a thin region (second subregion 68), in other words, that generated light is more absorbed in a place and less absorbed in another place. Accordingly, a light generated at the junction 70aa of the thick region 66 passes through this thicker region 66 and is emitted with optical power $P_{A1}$ and $P_{B1}$, respectively, through the light emitting windows (subwindows) 48A and 48B. On the other hand, a light generated at the junction 70ab of the thinner region 68 passes through the thinner region and is outputted with optical power $P_{A2}$ or $P_{B2}$ through the transparent insulating film 46A. The optical powers $P_{A2}$ and $P_{B2}$ in a unit area are, respectively, larger than the optical powers $P_{A1}$ and $P_{B1}$.

FIGS. 4(A), 4(B) and 4(C) are figures for explaining distribution of the optical power of an LED of the present invention. FIG. 4(A) is a plan view mainly showing a p-type semiconductor region 50 (64, 66 and 68) exposed from the insulating film 46 and p-side electrode 52. FIG. 4(B) is a power distribution curve diagram showing distribution of the power of light outputted from the respective positions in the direction along line II—II (in the width direction, which is perpendicular to the direction of arrangement of the LEDs). In FIG. 4(B), the abscissa represents a position and the ordinate represents an optical power (in an optional unit). FIG. 4(C) is a power distribution curve diagram showing distribution of the power of light outputted from the respective positions in the direction along line III—III (in the longitudinal direction, which is in the direction of arrangement of the LEDs). In FIG. 4(C), the abscissa represents a position and the ordinate represents an optical power (in an arbitrary unit). Corresponding regions are shown by symbols under the abscissas of FIGS. 4(B) and 4(C).

As shown in FIG. 4(B), in the width direction the optical power becomes the maximum power $I_{0+i}$ at the peripheral edge of the p-type semiconductor region 50 and at the central position in the width direction of the second subregion (shallower region) 68. In the second partial region, namely, the peripheral region 64, the optical power becomes lower as coming nearer to the first subregion (thicker region) 66 and becomes the minimum optical power $I_0$ at the first subregion 66. In the first subregion 66, the optical power is constantly kept at the optical power $I_0$. In the second subregion 68, the optical power becomes larger as coming more distant from one first subregion 66, reaches the maximum power $I_{0+i}$ at the middle position, and becomes smaller as coming nearer to the other first subregion 66, and then becomes again the optical power $I_0$ at the first subregion 66.

Since the p-side electrode 52 intercepts light, the optical power is suddenly reduced.

Both of the second partial region (peripheral region) 64 and the second subregion 68 are shallower than the first subregion 66. In those regions 64 and 68, therefore, the optical power in the longitudinal direction is constantly kept at the maximum power $I_{0+i}$ between both the peripheral edges of the p-type semiconductor region 50.

Figure 8B:
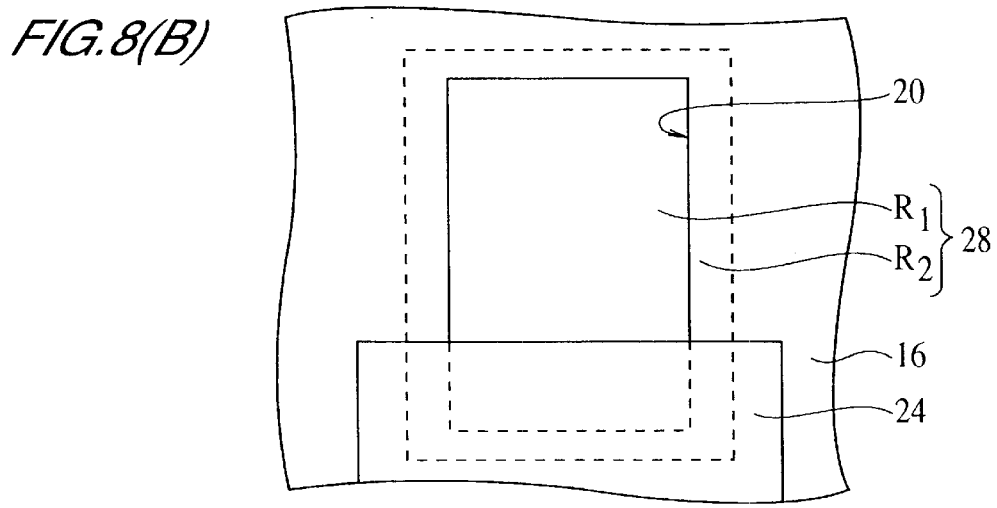
Figure 8C:
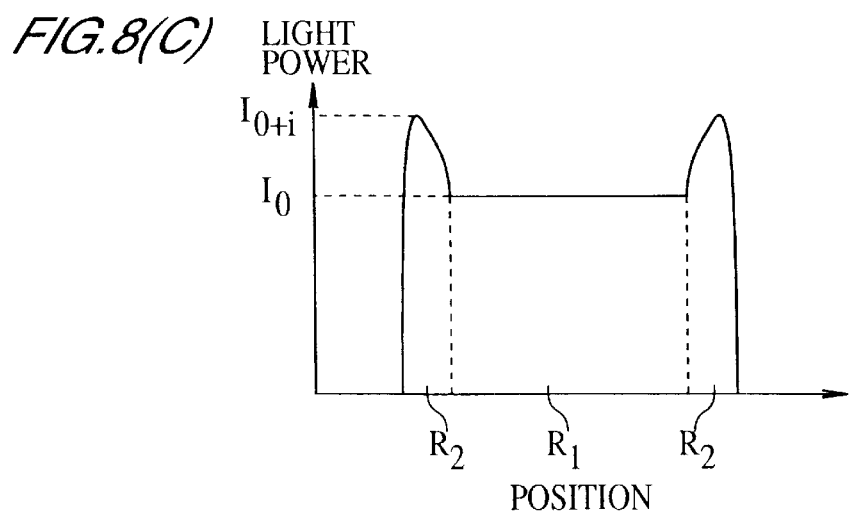
FIG. 8(C) is a diagram of distribution of the optical power of it.

It is assumed that the LEDs are formed out of the same material and under the same manufacturing conditions, and the total area of the upper surface of the p-type semiconductor region 50 is made equal to the total area of the upper surface of the p-type semiconductor region 28 of the former LED described with reference to FIG. 8. It is assumed that the depths $D_1$ and $L_1$ of both the LEDs are equal to each other. It is assumed that the area of the upper surface of the p-type semiconductor region which is covered with the p-side electrode is the same as each other in the former LED and in the LED of the present invention. In the LED of the present invention, since part of the upper surface is covered with the bridge 46A, the diffusion window is separated into two subwindows 48A and 48B. The total area of these diffusion subwindows 48A and 48B is smaller than the total area of the former diffusion window 20. In this case, the respective LEDs are caused to emit light by applying the same voltage between the n-side and p-side electrodes of the LED of the present invention and between the n-side and p-side electrodes of the former LED to let current flow at the same current density in the respective junctions. Since the LED of the invention has a region having a shallow junction, a light generated at the shallow junction passes through a part of the p-type region being thin in thickness to be outputted. Due to this, the absorption of light caused by the passing is fairly smaller than in case of passing through a thicker region. Therefore, the optical power per unit area of a light outputted from a region having a shallower junction is larger than the optical power per unit area of a light outputted from a region having a deeper junction. Thus, the total power of light outputted from an LED of the present invention is more heightened in comparison with a former LED.

In such a way as this, an LED of the present invention can heighten a quantity of light, namely, an optical power outputted from the LED corresponding to a reduction in absorption of light in the second conductive-type semiconductor region, without requiring current flow at a high density between the electrodes.

Next, an example of a method for manufacturing an LED described in FIGS. 1 to 4 and an LED array in which the LEDs are arranged is described with reference to FIGS. 5(A) to 5(E).

First, a substrate obtained by making a GaAsP layer epitaxial-grow on a GaAs wafer is prepared as an n-type semiconductor region 42. An impurity density of this substrate 42 is set as $(10 \text{ to } 40) \times (10^{16})/\text{cm}^3$, for example. On the upper surface 42a of the substrate 42, an insulating film 46 is provided by means of a known method (see FIG. 5(A)). In this embodiment, an SiN (silicon nitride) film or an $Al_2O_3$ film is provided as the insulating film 46. The upper surface of the substrate is partially exposed by forming diffusion windows 48 (48A, 48B) at a plurality of positions of the insulating film 46 according to known photolitho-etching technology. The area and shape of the subwindows 48A and 48B of the diffusion window 48 may be optionally determined according torequirements. An insulating film portion between both the subwindows is a bridge 46A (see FIG. 5(B)).

Next, a p-type semiconductor region 50 (50A and 50B) is formed in an n-type semiconductor region by introducing a p-type impurity into the n-type substrate 42, using the remaining insulating film 46 as a diffusion mask (see FIG. 5(C)). In this embodiment, it is preferable to use zinc (Zn) for example as this impurity. It is preferable to perform this introduction by means of a thermal diffusion method. After this, a p-type semiconductor region 50 is formed by thermally diffusing the introduced impurity. The maximum depth of the p-type semiconductor region 50 is set as 5 μm for example, and its impurity density is set as $(2 \text{ to } 10) \times (10^{19})/\text{cm}^3$ for example. It is preferable to perform heating for thermal diffusion at a temperature of 750° C. for 6 hours, for example. In this way, a pn junction 70 is formed at the interface between the n-type region and the p-type region.

Each of obtained p-type semiconductor regions 50A and 50B is formed as a region in which a first subregion 66 having a constant value $D_1$ in depth, a second subregion 68 located nearly under the bridge 46A, and a peripheral region, namely, a second partial region 64 surrounding these first and second subregions are joined together in one body. According to the structure of this embodiment, as described above, the second subregion 68 has a pn junction becoming shallower as the distance increases from the first subregions 66 at both sides, and this pn junction reaches the upper surface of the second subregion 68 at the middle in the width direction of the second subregion. On the other hand, the second partial region 64 has a pn junction becoming shallower as the distance increases from the first subregions 66, and this pn junction reaches the upper surface 42a of the substrate 42. As an example, the depth $D_1$ is set as 5 μm. And assuming that the total width of the second subregion in the width direction is 2 W, the width of the second partial region 64 is W. As an example, this width W is set as 4 μm.

Next, the n-side and p-side electrodes 44 and 52 are formed (see FIG. 5(D)). These electrodes can be easily formed by a known evaporation method. In this case, it is preferable to use Al as a material for the p-side electrode and AuGe as a material for the n-side electrode. The n-side electrode 44 is provided all over the under surface of the substrate 42. On the other hand, the p-side electrode 52 is formed so as to be in contact with the subwindow 48B as an individual electrode for each LED.

An LED array is formed by arranging the respective LEDs formed in this manner in a line (see FIG. 5(E)).

Figure 6A:
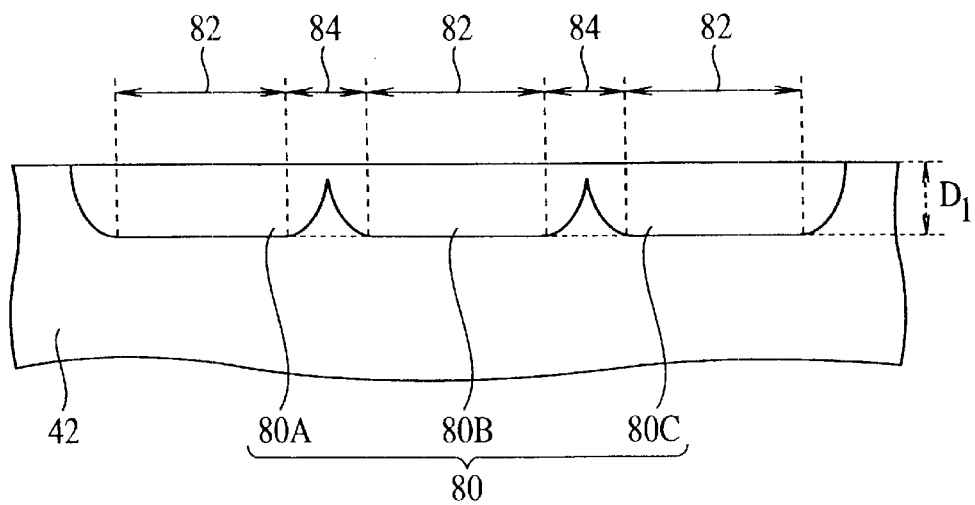
FIGS. 6 (A) and 6(B) are schematic sectional views of main parts showing respectively other structural examples of a light emitting diode of the invention.

It is apparent that an LED of the present invention is not limited to the above-mentioned structure but is able to have many modifications and variations. For example, instead of a single shallow junction region, a plurality of shallow junction regions (second subregions) may be provided in the first partial region. For example, as shown in FIG. 6(A), the second conductive-type semiconductor region 80 may be formed into three regions 80A, 80B and 80C continuously joined with one another each of which has a region 82 having a deep junction and a region 84 having a shallow junction. The maximum depths $D_1$ of these regions 80A, 80B and 80C are the same as one another. And the junction portions joining these regions 80A, 80B and 80C with one another vary continuously in depth.

Figure 6B:
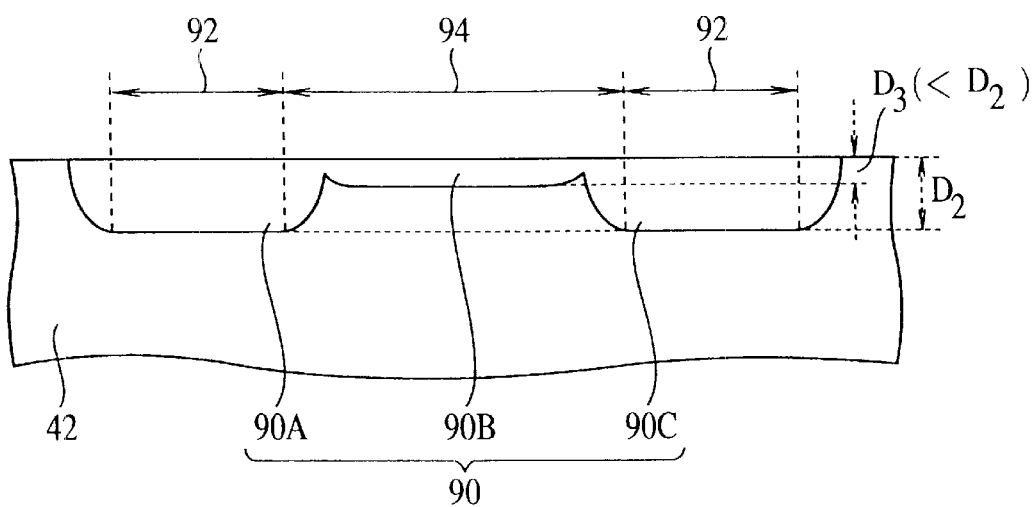
Figure 7:
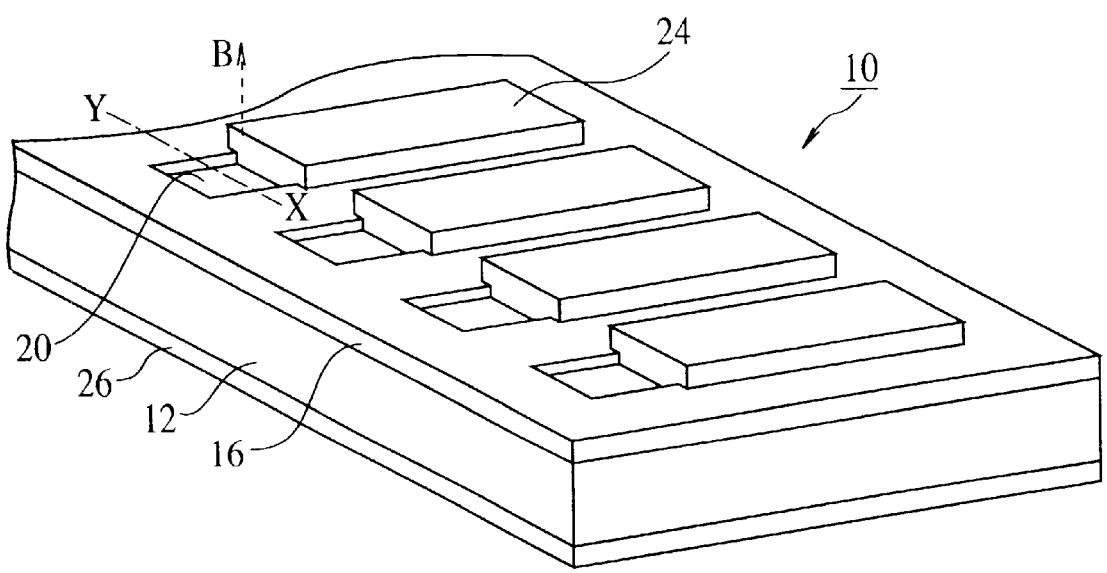
FIG. 7 is a schematic perspective view for explaining the structure of a former light emitting diode array.

Alternatively, as shown in FIG. 6(B), the second conductive-type semiconductor region 90 may be formed into three regions 90A, 90B and 90C continuously joined with one another, each of which has a region 92 having a deep junction and a region 94 having a shallow junction. The maximum junction depth $D_3$ of the region 90B (depth of the first subjunction) may be made shallower than the maximum depth $D_2$ of the regions 90A and 90C respectively at both sides of the region 90B (depth of the second subjunction). In this case also, the junction portions joining these regions 90A, 90B and 90C with one another vary continuously in depth.

In another preferable embodiment, the shallower junction portions may be formed in the shape of a matrix. Thus, how a region having a deep junction and a region having a shallow junction should be formed in the second conductive-type semiconductor region may be determined according to the degree the optical power of an LED should be heightened.

A two-dimensional shape of the second subregion may be a circle or any optional shape other than a tetragon. And the depth of junction may be discontinuous at a joining point of a deep junction portion of the bottom junction of the first partial region, namely, the first subjunction and a shallow junction portion, namely, the second subjunction. The second subjunction may be constant in depth, or may have a part being constant in depth and a part continuously varying in depth.

Although it is determined that the first conductive type is n-type and the second conductive type is p-type in the above-mentioned embodiments, it may be determined that the first conductive type is p-type and the second conductive type is n-type.

What is claimed is:

1. A light emitting diode comprising:

a semiconductor substrate having a first conductive-type semiconductor region and a second conductive-type semiconductor region which is buried in said first conductive-type semiconductor region from the upper surface of said first conductive-type semiconductor region and which forms a junction for emitting light with said first conductive-type semiconductor region, an insulating film provided on the upper surface of said substrate and having provided therein a window, and an electrode formed on said insulating film, wherein said junction has a bottom junction at the bottom of said second conductive-type semiconductor region and a side junction which is continuously joined with said bottom junction and is at a peripheral side face of said second conductive-type semiconductor region, said bottom junction varies in depth from the surface of said second conductive-type semiconductor region, said insulating film covering, with a window side peripheral portion thereof, said peripheral side face of said second conductive-type semiconductor region, said window exposing a tetragon-shaped portion of the surface of said second conductive-type semiconductor region, except said peripheral side face thereof, said electrode electrically contacting with the exposed portion of said second conductive-type semiconductor region and fully covering one of said peripheral side faces, and a side length of said window being shorter than an entire edge length of said electrode at the window side thereof.

2. A light emitting diode as claimed in claim 1, wherein:

said bottom junction has a first subjunction which is constant and is a maximum in said junction depth and a second subjunction which is continuously joined with said first subjunction and continuously varies in depth from the depth of said first subjunction to a depth shallower than the depth of said first subjunction.

3. A light emitting diode as claimed in claim 1, wherein:

said bottom junction has a first subjunction which is constant and is a maximum in said junction depth and a second subjunction which is continuously joined with said first subjunction and continuously varies in depth from the depth of said first subjunction to a depth shallower than the depth of said first subjunction, and said second subjunction is provided so as to separate said bottom junction into two parts and thereby forms two individual first subjunctions.

4. A light emitting diode as claimed in claim 1, wherein:

said bottom junction has a first subjunction which constant and is a maximum in said junction depth and a second subjunction which is continuously joined with said first subjunction and continuously varies in depth from the depth of said first subjunction to a depth shallower than the depth of said first subjunction, and said second subjunctions are formed in the shape of individual islands at a plurality of places.

5. A light emitting diode as claimed in claim 1, wherein:

said bottom junction has a first subjunction having a first depth which is a maximum in said junction depth, a second subjunction having a second depth which is shallower than said first depth, and a junction portion which continuously joins said first subjunction and said second subjunction with each other and continuously varies in depth.

6. A light emitting diode array in which a plurality of light emitting diodes as claimed in claim 1 are electrically insulated from one another and are arranged in a line.

* * * * *